United States Patent
Lo et al.

(10) Patent No.: US 7,096,441 B2
(45) Date of Patent: Aug. 22, 2006

(54) METHOD FOR GENERATING A COMMAND FILE OF A GROUP OF DRC RULES AND/OR A COMMAND FILE OF A GROUP OF LVS/LPE RULES

(75) Inventors: Chun-Wei Lo, Hsin-Chu (TW); Szu-Sheng Kang, Hsin-Chu (TW); Chien-Yi Ku, Hsin-Chu Hsien (TW); Chien-Tsung Chen, Taipei Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 206 days.

(21) Appl. No.: 10/709,502

(22) Filed: May 11, 2004

(65) Prior Publication Data

US 2005/0257183 A1    Nov. 17, 2005

(51) Int. Cl.
*G06F 17/50* (2006.01)
(52) U.S. Cl. .............................. 716/5; 716/4
(58) Field of Classification Search ............. 716/4, 716/5
See application file for complete search history.

(56) References Cited

U.S. PATENT DOCUMENTS

| | | | | |
|---|---|---|---|---|
| 5,754,826 A | * | 5/1998 | Gamal et al. | 703/14 |
| 2002/0138813 A1 | * | 9/2002 | Teh et al. | 716/5 |
| 2004/0107175 A1 | * | 6/2004 | Hung et al. | 707/1 |
| 2004/0107197 A1 | * | 6/2004 | Shen et al. | 707/9 |
| 2005/0086619 A1 | * | 4/2005 | Teh et al. | 716/5 |

\* cited by examiner

*Primary Examiner*—Sun James Lin
(74) *Attorney, Agent, or Firm*—Winston Hsu

(57) ABSTRACT

A method is capable of generating a command file of a group of design rule check (DRC) rules or layout versus schematic (LVS) rules and layout parasitic extraction (LPE) rules that can be used by a layout verification tool to verify the layout and the parasitic characteristics of an integrated circuit. The method comprises choosing whether to generate a command file of DRC rules or a command file of LVS/LPE rules, selecting a process from a group of processes, setting a set of parameters, and extracting program codes from a plurality of modules according to the selected process and the set of parameters so as to generate a command file of DRC rules or LVS/LPE rules.

15 Claims, 3 Drawing Sheets

METHOD FOR GENERATING A COMMAND FILE OF A GROUP OF DRC RULES AND/OR A COMMAND FILE OF A GROUP OF LVS/LPE RULES

BACKGROUND OF INVENTION

1. Field of the Invention

The present invention relates to generating a command file, and more particularly, to generating a command file of a group of DRC rules and/or a command file of a group of LVS/LPE rules to be used by a layout verification tool.

2. Description of the Prior Art

A computer programmed with layout verification software is normally used to verify that a design of an integrated circuit (IC) chip conforms to certain predetermined tolerances that are required by a process to be used in fabricating the chip, to ensure that a layout connectivity of the physical design of the IC matches the logical design of the IC represented by a schematic, and to extract parasitic resistance and capacitance of the IC. These are all very important steps for guaranteeing the properties of the chip manufactured by the process before the tape out of the circuit.

Tolerances for the process that is used to fabricate the IC, methods for checking the consistency between the physical design and the logical design of the IC, and the way to extract parasitic resistance and capacitance of the IC are often specified in the form of "rules". In an operation, these kinds of rules are called design rule check (DRC) rules, layout versus schematic (LVS) rules and layout parasitic extraction (LPE) rules respectively. Examples of DRC rules to be used in checking the design of an IC include minimum width, minimum spacing between elements of a circuit, minimum width of notches, checks for acute angles and self-intersecting polygons, and enclosures and overlap checks. Such DRC rules can be applied to actual layers that are to be fabricated in the chip, and also to derived layers that are formed by logical operations (such as not, and, or, and xor) on actual or derived layers or some combination thereof. Running a command file of LVS rules extracts devices and nets formed across layout hierarchy and compares them to the schematic netlist to ensure that a layout connectivity of the physical design of a circuit matches the logical design of the circuit represented by a schematic. For a command file of LPE rules, it helps to verify electromagnetic phenomena due to parasitic resistance and capacitance of the circuit.

With current technologies, command files of DRC rules and LVS/LPE rules used by a layout verification tool to verify the layout and the parasitic characteristics of an integrated circuit become more and more complicated. It is known that the verifications of ICs of different processes or packages require different command files of DRC and LVS/LPE rules. Consequently, the increasing metal options and bonding styles raise the quantity of the demand for command files dramatically. It is not easy to update thousands of lines of program codes manually without mistakes, and the load of maintaining the command files is heavy. In fact, there are a lot of rule statements sharing the same command, and there are some blocks of commands can be shared for different layout verification function. However, with the method for generating command files according to prior art, different command files can only be generated individually. Therefore it costs a lot of time and effort to generate new command files with different parameters even the new command files are only a little different from other existing ones.

There are already lots of such layout verification tools on the market but they all suffer from the aforementioned problems of maintaining program codes. And the generation of a new command file for verifying the fabrication of ICs by different process or of different parameters is very inefficient.

SUMMARY OF INVENTION

It is therefore a primary objective of the claimed invention to provide a method for generating a command file of a group of design rule check (DRC) rules or layout versus schematic (LVS) rules and layout parasitic extraction (LPE) rules that can be used by a layout verification tool to verify the layout and the parasitic characteristics of an integrated circuit.

Briefly described, the claimed invention discloses a method capable of generating a command file of a group of design rule check (DRC) rules or layout versus schematic (LVS) rules and layout parasitic extraction (LPE) rules by extracting program codes from a plurality of modules. The method comprises choosing whether to generate a command file of DRC rules or a command file of LVS/LPE rules, selecting a process from a group of processes, setting a set of parameters, and extracting program codes from a plurality of modules according to the selected process and the set of parameters so as to generate a command file of DRC rules or LVS/LPE rules.

It is an advantage of the present invention that utilization of a plurality of modules of program codes helps generating a command file of DRC rules or LVS/LPE rules efficiently. In the present invention, programs codes for different processes, different numbers of metal layers and poly-silicon layers are stored in a plurality of modules according to their attributes. When generating a command file of DRC rules or LVS/LPE rules of a certain process, a certain numbers of metal layers and poly-silicon layers, program codes corresponding to these selection and settings are extracted from the plurality of modules and combined together to form the command file. Besides, the program codes are maintained in the modules. This results in more efficient updates of the command files and generations of command files of different processes and with different parameters.

These and other objectives of the present invention will no doubt become obvious to those ordinary skill in the art after reading the following detailed description of preferred embodiments that are illustrated in various figures and drawings given below.

DETAILED DESCRIPTION

The primary reason for utilizing a plurality of modules for storing program codes of different attributes is to relieve the load of maintaining the command files. It is known that to form a command file of DRC rules or LVS/LPE rules of a certain process, program codes for settings of a verification tool of the process, fabrication parameters of the processes, layer definitions of the process, program codes of operation definitions of the processes, and program codes for declaring devices of different processes are needed. In the present invention, five modules are provided in order to store program codes: (1) a header module comprising program codes for settings of a verification tool of different processes; (2) a variable module comprising (program codes for setting) fabrication parameters of different processes; (3) a layer module comprising (program codes for setting) layer definitions of different processes; (4) an operation module comprising program codes of operation definitions of different processes; and (5) a device module comprising program codes for declaring devices of different processes. Program codes of the same attributes for different processes and packages are stored in the same module.

When generating a command file, the program codes are extracted from the modules according to the process and the settings of parameters.

Figure 1:
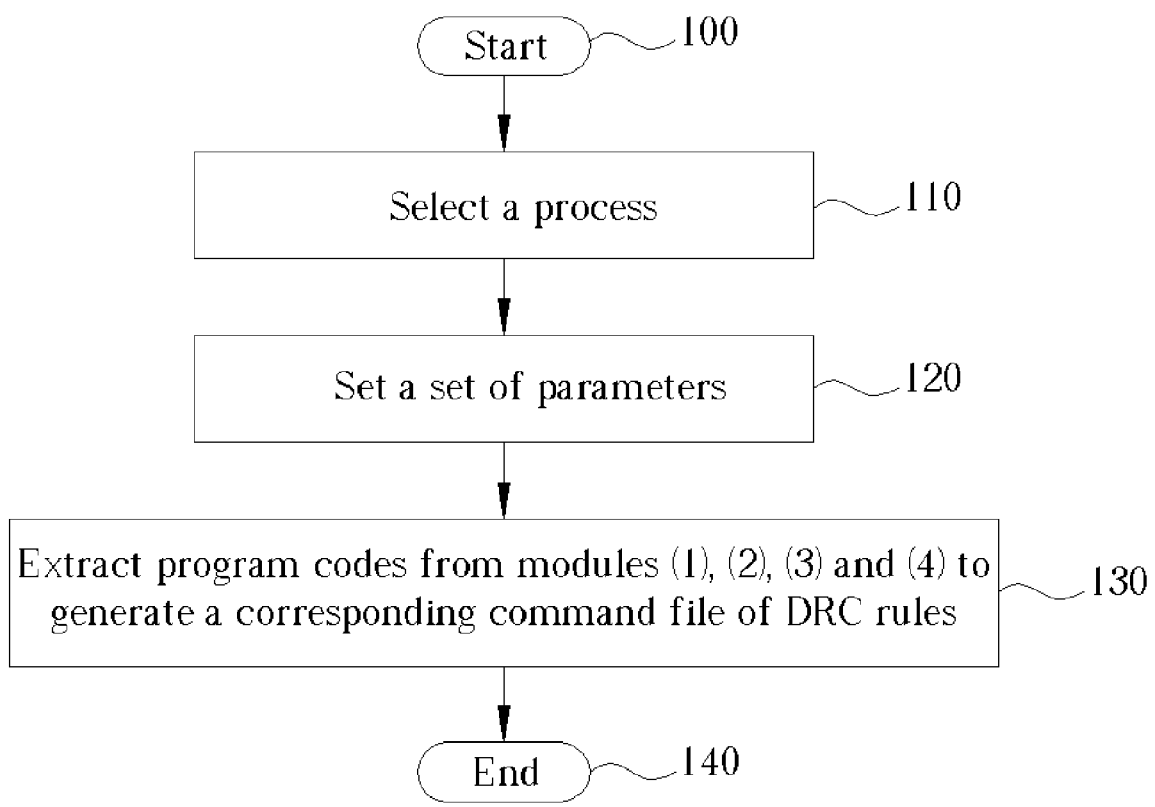
FIG. 1 is a flow chart of generation of command files of DRC rules according a preferred embodiment of to the present invention.

Please refer to FIG. 1. FIG. 1 shows a flow chart of generation of command files of DRC rules according to a preferred embodiment of the present invention.

Step 100: Start;

Step 110: Select a process from a group of processes;

Step 120: Set a set of parameters;

Step 130: Extract program codes from modules (1), (2), (3), and (4) according to the selected process and the set of parameters so as to generate a corresponding command file of DRC rules;

Step 140: End.

A command file of DRC rules for verifying ICs to be fabricated by a 0.18 um, 4-metal-layers and 1-polysilicon-layer process is taken for example to explain the procedure of the claimed method. According to the present invention, first of all, the 0.18 um process is selected among all available processes. Second, the parameters of the ICs are set. For example, the number of metal layers and the number of poly-silicon layers are set 4 and 1 respectively. When the process and the parameters are set and selected, program codes are extracted from modules (1), (2), (3), and (4), which are displayed above, according to the selected process and parameters.

For instance, program codes for settings of the verification tool of 0.18 um process rather than other program codes that are for settings of other processes are extracted from the module (1). Program codes for defining the minimum length and the dielectric constant of 0.18 um are extracted from module (2). Program codes for setting definitions of each layer of the selected process are extracted from the module (3). Program codes for operation definitions such as AND, OR, NOT and NOR of 0.18 um process are extracted from the module (4). All these extracted program codes are combined together to generate a command file of DRC rules for ICs fabricated by the 0.18 um, 4-metal-layers and 1-polysilicon-layer process.

Figure 2:
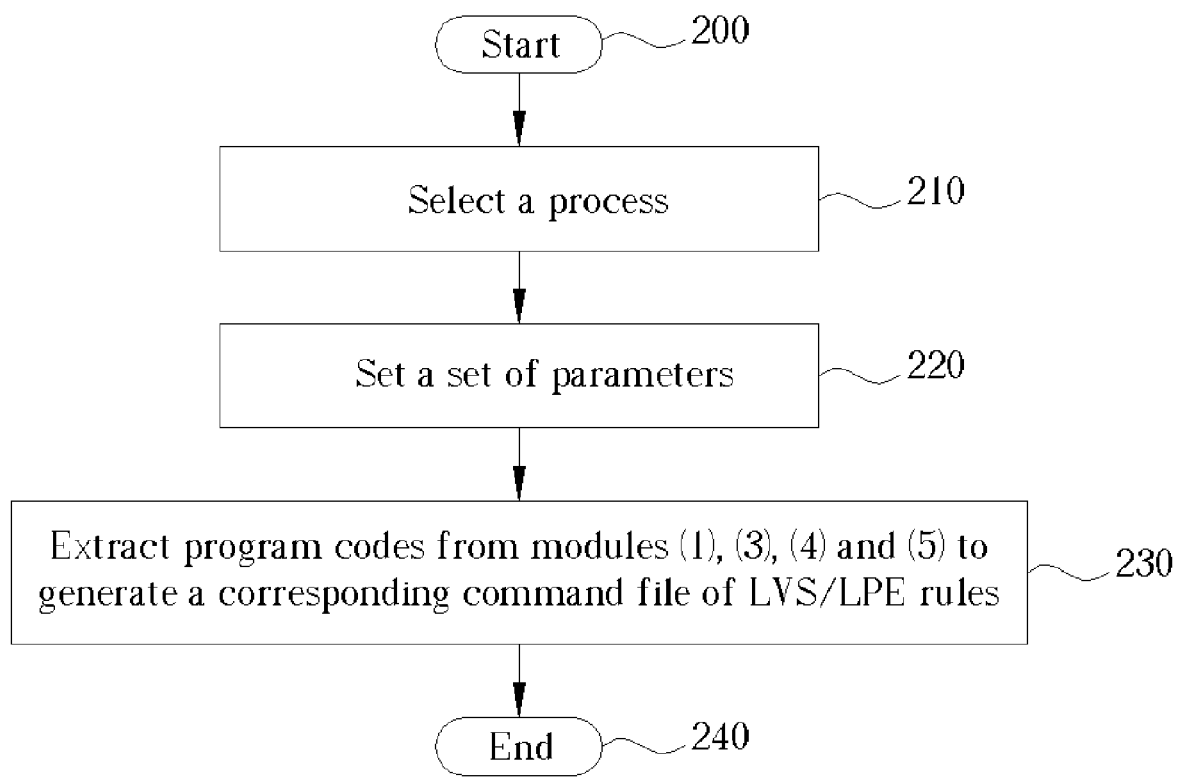
FIG. 2 is a flow chart of generation of command files of LVS/LPE rules according to a preferred embodiment of the present invention.

The same procedures can be applied to generate a command file of LVS/LPE rules. FIG. 2 shows a flow chart of generation of command flies of LVS/LPE rules according to a preferred embodiment of the present invention.

Step 200: Start;

Step 210: Select a process from a group of processes;

Step 220: Set a set of parameters;

Step 230: Extract program codes from modules (1), (3), (4) and (5) according to the selected process and the set of parameters so as to generate a corresponding command file of LVS/LPE rules;

Step 240: End.

For a command file of LVS/LPE rules, there is no need to define fabrication variables such like dielectric component but a need for declaring devices of the selected process. Therefore the module (2) is taken off and the module (5) is included.

A command file of LVS/LPE rules for verifying ICs to be fabricated by a 0.18 um, 3-metal-layers, and 2-polysilicon-layer process is taken for example to explain the procedure of the claimed method. According to the present invention, first of all, the 0.18 um process is selected among all available processes. Second, the parameters of the ICs are set. For example, the number of metal layers and the number of poly-silicon layers are set 3 and 2 respectively. When the process and the parameters are set and selected, program codes are extracted from modules (2), (3), (4) and (5), which are displayed above, according to the selected process and parameters. For instance, program codes for defining the minimum length and the dielectric constant of 0.18 um rather than other program codes that are for settings of other processes are extracted from module (2). Program codes for setting definitions of each layer of the selected process are extracted from the module (3). Program codes for operation definitions such as AND, OR, NOT, and NOR of 0.18 um process are extracted from the module (4). And program codes for declaring devices of 0.18 um process rather than other program codes are extracted from the module (5). Compared to the example explaining the procedure for generating a command file of a 0.18 um, 4-metal-layers, and 1-polysilicon-layer process, program codes defining the fourth metal layer are not included but those defining the second poly-silicon layer are extracted from the modules because there are only three metal layers but 2 poly-silicon layers in the target process. All these extracted program codes are combined together to generate the command file of DRC rules for ICs fabricated by the 0.18 um, 3-metal-layers, and 2-polysilicon-layer process.

Figure 3:
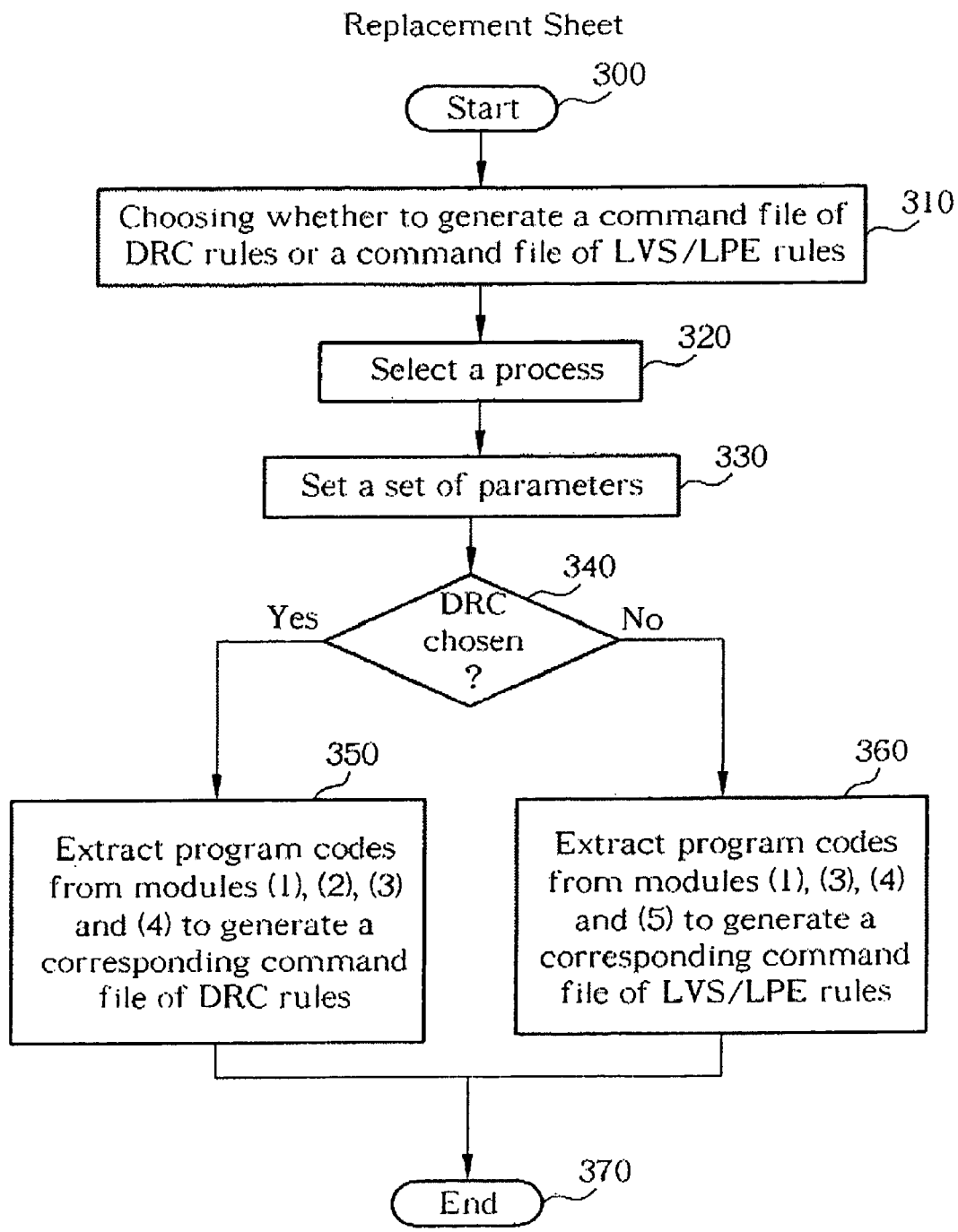
FIG. 3 is a flow chart of generation of command files of DRC rules and/or LVS/LPE according to a preferred embodiment of the present invention.

As described above, different modules of program codes are needed when generating different kind of command files. If all the five aforementioned modules of program codes are provided, the claimed method is capable of generating both command files of DRC rules and command files of LVS/LPE rules. Please refer to FIG. 3. Shown in FIG. 3 is a flow chart of the generation of command files of DRC or/and LVS/LPE rules according to a preferred embodiment of the present invention.

Step 300: Start;

Step 310: Choosing whether to generate a command file of DRC rules or a command file of LVS/LPE rules Step 320: Select a process from a group of processes;

Step 330: Set a set of parameters;

Step 340: If a command file of DRC rules is chosen in step 310, go to step 350; else go to step 360;

Step 350: Extract program codes from modules (1), (2), (3) and (4) according to the selected process and the set of parameters so as to generate a corresponding command file of DRC rules;

Step 360: Extract program codes from modules (1), (3), (4) and (5) according to the selected process and the set of parameters so as to generate a corresponding command file of LVS/LPE rules;

Step 370: End.

The present invention discloses a method for generating a command file of a group of DRC rules and/or LVS/LPE rules to be used by a layout verification tool to verify the layout and the parasitic characteristics of an integrated circuit efficiently. Program codes for different processes are stored in a plurality of modules systematically. The program codes stored in the plurality of modules are extracted and combined together to form a command file of a certain process according to the process and other parameters. When there is any update or new information, the program codes are maintained in the modules. In the claimed invention, commands in the command file of DRC rules or LVS/LPE rules are parameterized. The program codes can be reused to form different command files that share some same properties. Similarly, when a program code is updated, the command files that adopt the program code do not need to be maintained individually. A generator program can be designed for performing the generation of command files of DRC rules and/or LVS/LPE rules according to the present invention automatically.

In contrast to the prior art, command files of DRC rules and LVS/LPE rules are not generated individually but are generated by extracting program codes from modules in the claimed invention. Therefore, the efficiency of the maintenance and optimization of the program codes, hence the command files, is increased substantially.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for generating a command file of a group of design rule check (DRC) rules for being used by a layout verification tool to verify a design of an integrated circuit, the method comprising:
   (a) selecting a process from a group of processes;
   (b) setting a set of parameters;
   (c) extracting program codes from a plurality of modules according to the selected process and the set of parameters; and
   (d) combining the program codes extracted from the plurality of modules to form a corresponding command file of the group of DRC rules to be run by the layout verification tool to verify the design of the integrated circuit.

2. The method of claim 1 further comprising:
   (e) generating the plurality of modules, the plurality of modules comprising:
      a header module comprising program codes for settings of a verification tool of different processes;
      a variable module comprising program codes for setting fabrication parameters of different processes;
      a layer module comprising program codes for setting layer definitions of different processes; and
      an operation module comprising program codes of operation definitions of different processes.

3. The method of claim 1 wherein the set of parameters comprises number of metal layers.

4. The method of claim 1 wherein the set of parameters comprises number of poly-silicon layers.

5. The method of claim 1 wherein the set of parameters comprises package parameters.

6. A method for generating a command file of a group of layout versus schematic (LVS) rules and layout parasitic extraction (LPE) rules to be used by a layout verification tool to verify a layout and the parasitic characteristics of an integrated circuit, the method comprising:
   (a) selecting a process from a group of processes;
   (b) setting a set of parameters;
   (c) extracting program codes from a plurality of modules according to the selected process and the set of parameters; and
   (d) combining the program codes extracted from the plurality of modules to form a corresponding command file of the group of LVS/LPE rules to be run by the layout verification tool to verify the layout and parasitic characteristics of the integrated circuit.

7. The method of claim 6 further comprising:
   (e) generating a plurality of modules, the plurality of modules comprising:
      a header module comprising program codes for settings of a verification tool of different processes;
      a layer module comprising program codes for setting layer definitions of different processes;
      an operation module comprising program codes of operation definitions of different processes; and
      a device module comprising program codes for declaring devices of different processes.

8. The method of claim 6 wherein the set of parameters comprises number of metal layers.

9. The method of claim 6 wherein the set of parameters comprises number of poly-silicon layers.

10. The method of claim 6 wherein the set of parameters comprises package parameters.

11. A method for generating a command file of a group of design rule check (DRC) rules or layout versus schematic (LVS) rules and layout parasitic extraction (LPE) rules to be used by a layout verification tool to verify a layout and parasitic characteristics of an integrated circuit, the method comprising:
   (a) choosing whether to generate a command file of DRC rules or a command file of LVS/LPE rules;
   (b) selecting a process from a group of processes;
   (c) setting a set of parameters;
   (d) extracting program codes from a plurality of modules according to the choice in step (a), the selected process, and the set of parameters; and
   (e) combining program codes extracted from a plurality of modules to form the command file of the group of DRC rules or the command file of the group of LVS/LPE rules to be run by the layout verification tool.

12. The method of claim 11 further comprising;
   (f) generating a plurality of modules, the plurality of modules comprising:
      a header module comprising program codes for settings of a verification tool of different processes;
      a variable module comprising program codes for setting fabrication parameters of different processes;
      a layer module comprising program codes for setting layer definitions of different processes;
      an operation module comprising program codes of operation definitions of different processes; and
      a device module comprising program codes for declaring devices of different processes.

13. The method of claim 11 wherein the set of parameters comprises number of metal layers.

14. The method of claim 11 wherein the set of parameters comprises number of poly-silicon layers.

15. The method of claim 11 wherein the set of parameters comprises package parameters.

* * * * *